United States Patent
Jeckeln (10) Patent No.: US 8,908,797 B2
(45) Date of Patent: Dec. 9, 2014

(54) APPARATUS AND METHOD FOR TIME ALIGNMENT OF AN ENVELOPE TRACKING POWER AMPLIFIER

(75) Inventor: Ernesto G. Jeckeln, Richardson, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 339 days.

(21) Appl. No.: 13/414,139

(22) Filed: Mar. 7, 2012

(65) Prior Publication Data

US 2013/0235949 A1   Sep. 12, 2013

(51) Int. Cl.
 *H04L 25/17* (2006.01)
 *H03F 1/26* (2006.01)
 *H04B 1/16* (2006.01)

(52) U.S. Cl.
 USPC ......... 375/297; 330/149; 330/151; 455/114.3

(58) Field of Classification Search
 CPC ....... H03F 1/32; H03F 1/3223; H03F 1/3242; H03F 1/3247; H03F 1/3252; H03F 1/34; H03F 1/347; H03F 1/38
 USPC .................. 375/260, 295–297; 330/149, 151; 370/210; 455/114.3
 See application file for complete search history.

(56) References Cited

U.S. PATENT DOCUMENTS

| | | | |
|---|---|---|---|
| 2003/0156658 A1* | 8/2003 | Dartois | 375/297 |
| 2008/0095264 A1* | 4/2008 | Deng et al. | 375/296 |
| 2009/0097591 A1 | 4/2009 | Kim | |

FOREIGN PATENT DOCUMENTS

KR   10-2009-0036670 A   4/2009

* cited by examiner

*Primary Examiner* — Young T. Tse
(74) *Attorney, Agent, or Firm* — Jefferson IP Law, LLP (57) ABSTRACT

An apparatus and method for a Time Alignment (TA) operation used by an Envelope Tracking (ET) Radio Frequency (RF) Power Amplifier (PA) that amplifies RF signals are provided. The ET RF PA has an input signal including complex, reference, and feedback signals. The apparatus includes a fast convolution unit for receiving the reference signal and the feedback signal, fore extracting respective envelopes of the reference signal and the feedback signal, for generating a cross-covariance vector for the reference signal envelope and the feedback signal envelope, a delay estimation unit for receiving the cross-covariance vector from the fast convolution unit, for determining peak values of the cross-covariance vector, for performing a fine time delay estimation, and for generating time delay settings according to the fine time delay estimation, and delay filters respectively delaying a timing of the reference signal and the feedback signal according to the generated time delay settings.

16 Claims, 9 Drawing Sheets

APPARATUS AND METHOD FOR TIME ALIGNMENT OF AN ENVELOPE TRACKING POWER AMPLIFIER

BACKGROUND OF THE INVENTION

1. Field of the Invention

The present invention relates to an apparatus and method for time alignment of an Envelope Tracking (ET) Radio Frequency (RF) Power Amplifier (PA). More particularly, the present invention relates to an apparatus and method for a time alignment operation used by a ET RF PA that amplifies RF signals.

2. Description of the Related Art

In recent years, the use of mobile communications using wireless communication networks has become widespread, thus, increasing a demand for faster, higher bandwidth, and more efficient wireless communication networks. The wireless communication networks communicate using RF signals propagated in the wireless communication networks that may be divided into communication cells. The communication cells, providing wireless communication to mobile devices located in respective coverage areas of the communication cells, may include Base Stations (BSs) that include RF transmitters and Digital Signal Processing (DSP) units. The RF transmitters include power amplifiers in order to amplify the RF signals propagated in the communication cells in order to perform wireless communication between the BSs and the mobile devices located in the respective coverage areas. The DSP units provide processing of the RF signals that are to be transmitted by the RF transmitters according to algorithms of the DSP units.

Time Alignment (TA) algorithms which are suitable for the ET RF PA, are DSP algorithms that can be implemented via software so as to run or be executed on specialized processors such as a DSP-Central Processing Unit (CPU). Alternatively, the TA algorithms may be implemented via hardware so as to run or be executed on purpose-built hardware processors such as field-programmable gate arrays (FPGAs). Furthermore, the TA algorithms may be implemented via a combination of software and hardware. TA algorithms present considerable challenges towards achieving a cost-effective DSP implementation. The TA algorithms are based on cross-correlation/cross-covariance techniques, and thus, the TA algorithms present a high computational complexity require large amounts of silicon resources of FPGAs or large amounts of computation time of the DSP-CPU.

The TA algorithms are computed in order to perform the TA operation, and a critical parameter of the TA algorithms is a time resolution of the TA computation. The time resolution of the TA computation may be of an order or magnitude that is 20 times a sampling rate of the system. In order to achieve optimal ET performance in the ET-PA, a time mismatch sensitivity should be in a range of 200 picoseconds to 400 picoseconds. However, such a range for the time mismatch sensitivity requires a high time resolution. Furthermore, the high time resolution for the TA computation uses a cross-correlation function performed with high accuracy in order to determine an accurate peak location. Because the computational accuracy is proportional to a signal length captured by the DSP system, wherein the signal length is N samples long, the TA computation will involve the processing of large data arrays stored in memory.

The processing of the large data arrays resulting from the high time resolution makes the implementation of the TA algorithm impractical. Accordingly, many implementations of the TA algorithms rely upon incremental adjustments that use multiple measurements of the RF signal in conjunction with an iterative process. Beside the iterative process, other implementation of the TA algorithm may use an off-line technique, wherein the estimation is performed during a calibration step occurring before real time operations using the cross-correlation function. However, in the off-line technique, consideration is not given to temperature variations during the real time operation. In addition, if any variant from the off-line technique is suitable for on-line operation, it requires processing the cross-correlation estimation two times, which substantially increases computation time.

In order to satisfy the growing demand for wireless communications and wireless services, highly linear multi-carrier RF and/or microwave transmitters having high power efficiency and increasingly sophisticated circuit topologies are being developed. These topologies combine an efficient distortion compensation technique, such as Digital Pre-Distortion (DPD), with high efficiency power amplification techniques, such as Envelope Elimination and Restoration (EER), Envelope Tracking (ET), Doherty power amplification, switching mode families, or other similar amplification techniques, and the TA algorithms play important role in all of the above noted distortion compensation techniques and the power amplification techniques.

Figure 1:
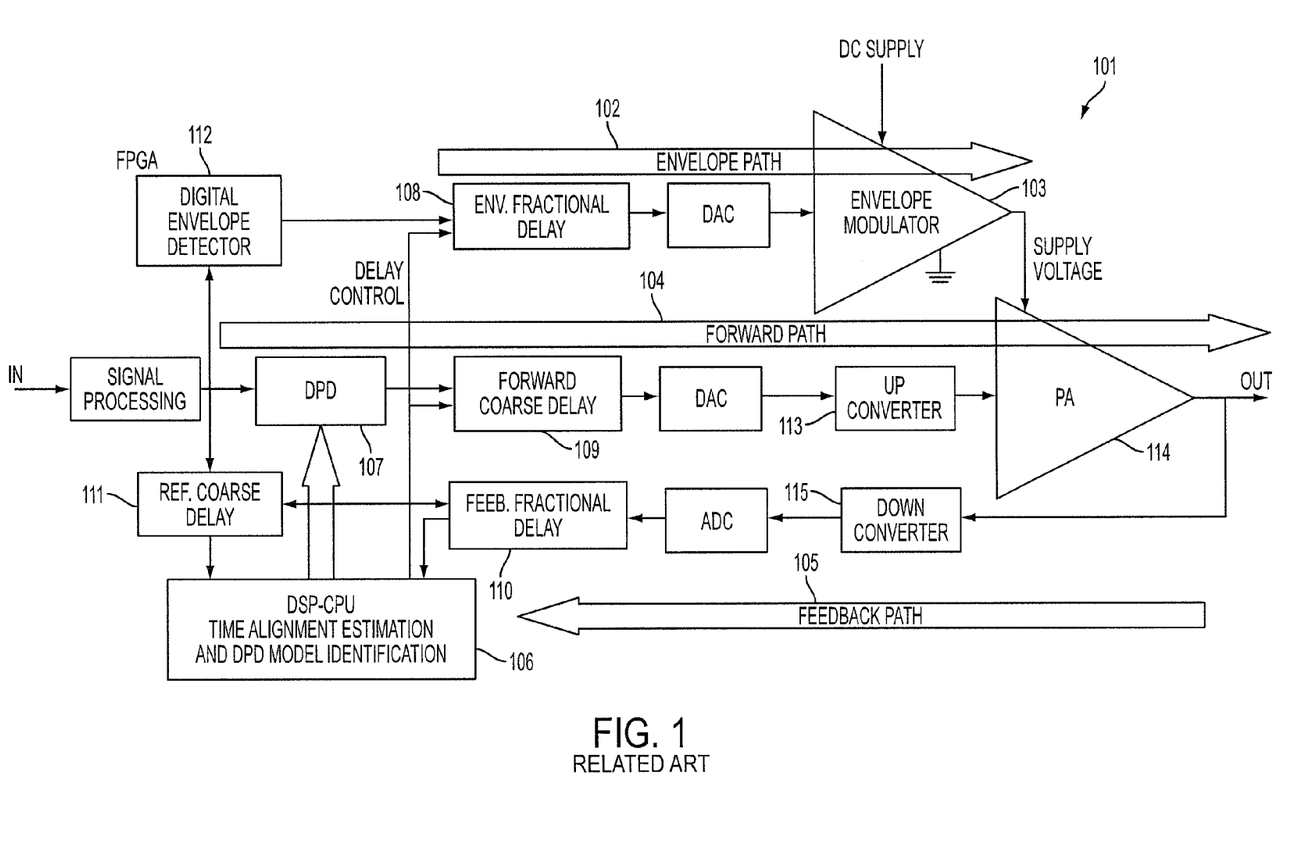
FIG. 1 is a block diagram of high efficiency signal amplification according to the related art.

FIG. 1 is a block diagram of high efficiency signal amplification according to the related art.

Referring to FIG. 1, the illustrated process of high-efficiency signal amplification may be suitable for EER and ET amplifier systems. The ET amplifier system 101 uses an envelope path 102, which includes a DC power supply 103 capable of delivering modulation power throughout the bias of a conventional Class AB Power Amplifier (PA). During the amplification process, a complex signal is sent through a forward path 104, while a corresponding envelope waveform is simultaneously sent through the envelope path 102 to drive the PA bias. A feedback path 105 is used to monitor the PA performance and to capture a batch of data output from the PA in order to perform DPD modeling and TA.

As shown in FIG. 1, the ET amplifier system also includes a DSP environment containing a DSP-Central Processing Unit (DSP-CPU) 106 to process both the DPD modeling and TA estimation, a DPD processor 107 for nonlinear distortion cancellation, and four TA units for time mismatch cancellation. The four TA blocks include an envelope fractional delay 108, a forward coarse delay 109, a feedback fractional delay 110, and a reference coarse delay 111. In addition, the ET amplifier includes a digital envelope detector 112 cascaded with an envelope modulator in the envelope path, an up-converter 113 followed by a RF-PA 114 in the forward path, and a down converter 115 in the feedback path. A signal processing block 116, which is disposed at the input of the ET amplifier system 101 so as to be before the DPD block 107 performs filtering, interpolation and Crest Factor Reduction functions.

The PA using ET performs with better power efficiency than PAs of the related art and/or PAs using other related art power amplification techniques. However, an Adjacent Channel Leakage Ratio (ACLR) at the output of the PA using ET is highly sensitive to a delay mismatch between the envelope path and the forward path to the PA. To mitigate a time mismatch resulting from the delay mismatch, the ET system may use a delay control for the envelope and forward paths. It should be noted that the time mismatch between a reference signal and a feedback signal does not have a direct impact on ET performance. However, the time mismatch between the reference signal and the feedback signal does have an effect on the DPD modeling for the DPD model located in the DPD block of the PA using ET. A time mismatch included in the modeling process affects the characteristic of the distortion generated by the DPD model which is used to cancel distortion from the PA nonlinearity.

The computation time of the TA algorithm is a critical parameter for an on-line technique for computing the TA algorithm. Accordingly, a program speed for a program running the algorithm depends on how the digital hardware, such as the DSP processor, processes the data. A typical DSP processor includes a high-speed on-chip memory to allow for quick access to stored data, such as the data arrays for signal processing. However, when the data arrays to be used by the TA algorithm are too large for the on-chip memory, the data arrays need to be constantly moved from being stored in the on-chip memory to being stored in an off-chip external memory. The data arrays used for a highly accurate cross-correlation method having a large number of samples may be too large to store on the on-chip memory, and thus may be subject to being constantly moved from the on-chip memory to the off-chip memory during a DSP operation. As a result, a program flow is slowed such that the computation time is increased. The slow program flow and increased computation time has a direct impact on the ET performance when parameter adaptation of the TA algorithm or data array is performed.

Accordingly, there is a need for an apparatus and method for implementing an algorithm that employs a low number of samples in the TA computation in order to allow use of a high-speed on-chip memory, wherein the small size of data does not produce a performance penalty producing poor results for the TA computation. In addition, it is desirable to have an algorithm that could efficiently extract data objects, representative of the time mismatch information, from large data structures stored in the external memory. It is also desirable to have an algorithm that quickly responds to temperature or other physical variations.

SUMMARY OF THE INVENTION

Aspects of the present invention are to address at least the above-mentioned problems and/or disadvantages and to provide at least the advantages described below. Accordingly, an aspect of the present invention is to provide an apparatus and method for a time alignment operation used by an Envelope Tracking (ET) Radio Frequency (RF) Power Amplifier (PA) that amplifies RF signals.

In accordance with an aspect of the present invention, a method for performing Time Alignment (TA) for an ET RF PA having an input signal, including a complex signal, that is propagated along a forward path of the ET RF PA having a forward path delay, a reference signal that is propagated along a zero-delay reference path of the ET RF PA, and a feedback signal, extracted from an output node of the ET RF PA, propagating along a feedback path having a feedback path delay is provided. The method includes generating samples of the reference signal and the feedback signal at a sampling rate of 1/N to generate a captured sequence of data having a length of N samples, calculating a cross-covariance of the feedback signal and the reference signal according to the captured sequence of data in order to generate a cross-covariance vector, determining peak values and corresponding index values of the N samples of the cross-covariance vector, determining a loop peak index and an envelope peak index, determining a delay difference between the envelope peak index and the loop peak index, determining an envelope delay and a loop delay respectively according to the envelope peak index and the loop peak index, performing a fine time delay estimation in order to generate a fractional envelope delay and a fractional loop delay respectively according to the envelope peak index and the loop peak index, and generating time delay settings according to the delay difference, the loop delay, the envelope delay, the fractional loop delay, and the fractional envelope delay, wherein the time delay settings include a coarse reference delay, a coarse forward delay, a fractional envelop delay and a fractional feedback delay.

In accordance with another aspect of the present invention, an apparatus for an Envelope Tracking (ET) Radio Frequency (RF) Power Amplifier (PA) having an input signal, including a complex signal, that is propagated along a forward path of the ET RF PA having a forward path delay, a reference signal that is propagated along a zero-delay reference path of the ET RF PA, and a feedback signal, extracted from an output node of the ET RF PA, propagating along a feedback path having a feedback path delay is provided. The apparatus includes a fast convolution unit for receiving the reference signal and the feedback signal, fore extracting respective envelopes of the reference signal and the feedback signal, for generating a cross-covariance vector for the reference signal envelope and the feedback signal envelope, a delay estimation unit for receiving the cross-covariance vector from the fast convolution unit, for determining peak values of the cross-covariance vector, for performing a fine time delay estimation, and for generating time delay settings according to the fine time delay estimation, and delay filters respectively delaying a timing of the reference signal and the feedback signal according to the generated time delay settings.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions are omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention are provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

Exemplary embodiments of the present invention include an apparatus and method for time alignment of an Envelope Tracking (ET) Power Amplifier (PA) system. More particularly, the present invention relates to an apparatus and method for a time alignment operation used by an ET Radio Frequency (RF) PA that amplifies RF signals.

Exemplary embodiments of the present invention, as described below, disclose a robust method for ET time alignment allowing for a highly accurate one-shot time mismatch estimation, wherein the estimation is executed in a reduced computation time. The exemplary embodiments of the present invention use a non-iterative process of a fast convolution technique in conjunction with an accurate interpolation algorithm so that the numbers of samples to be processed to calculate the one-shot time mismatch estimation can be reduced.

By using a circular convolution theorem, the below described exemplary embodiments of the present invention estimate a cross-covariance of envelope waveforms, from both reference and feedback signals, by computing inverse Fourier transforms of the products of individual Fourier transforms. Samples of the resulting cross-covariance waveform are sectored, based on an optimal peak search algorithm, in order to extract a very low number of samples that are representative of the correlation peaks. Each of the correlation peaks is interpolated by curve fitting based on spline interpolation or Newton's forward interpolation method. The main advantage of this approach is the use of a very short data structure that allows a Digital Signal Processing (DSP) processor to process data using on-chip memory. Additionally, this approach requires considerably fewer arithmetical operations to achieve a required level of accuracy and processing time for the ET-PA System.

Figure 2:
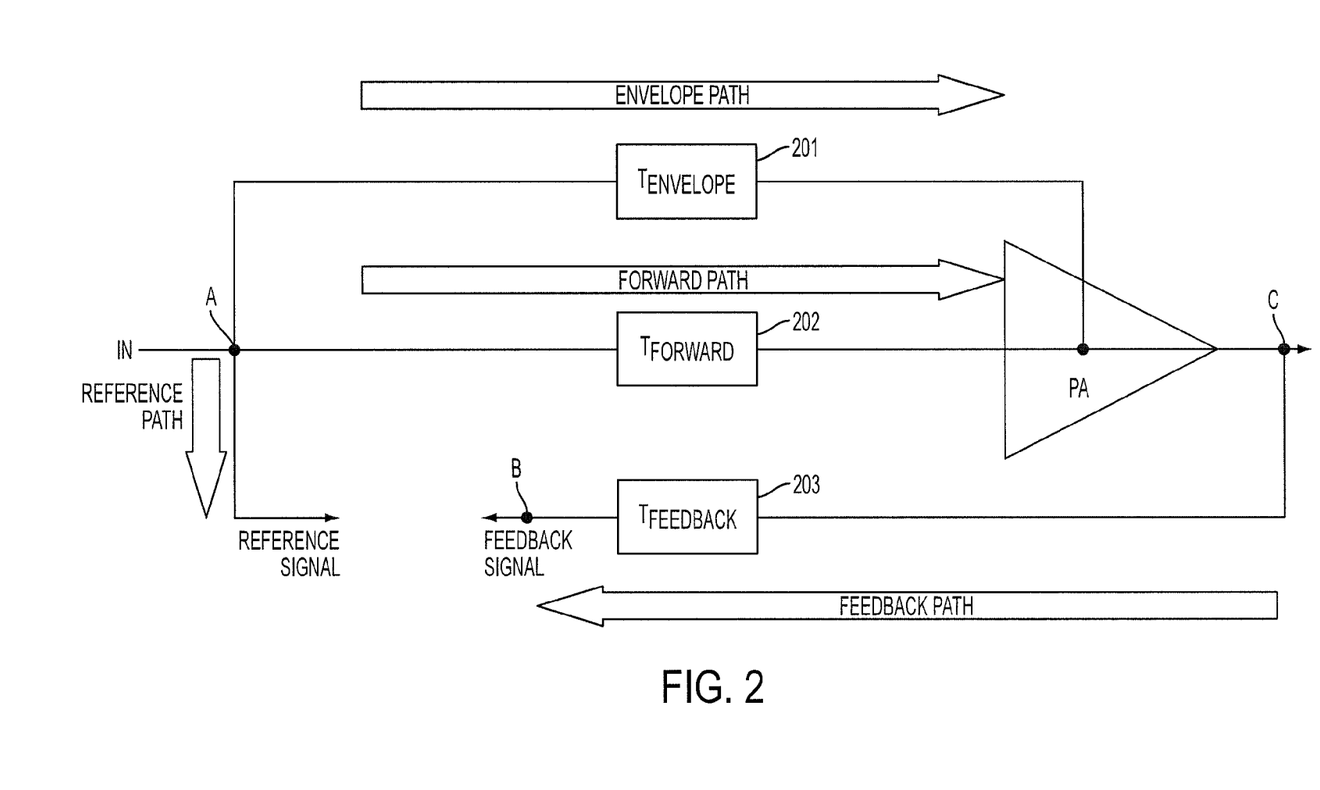
FIG. 2 is a simplified block diagram illustrating signal paths according to an exemplary embodiment of the present invention.

FIG. 2 is a simplified block diagram illustrating signal paths according to an exemplary embodiment of the present invention.

Referring to FIG. 2, an envelope path, a forward path, and a feedback path are illustrated. Additionally, an envelope path delay $T_{ENVELOPE}$ 201, a forward path delay $T_{FORWARD}$ 202, and a feedback path delay $T_{FEEDBACK}$ 203 are illustrated as blocks along respective signal paths. An input signal is applied to a node A, from which the envelope path and the forward path egress, and an output signal is output from a PA at an output node C. The reference signal is propagated along a reference path that is considered to have zero delay. The DSP system captures the reference signal at the node A and captures a feedback signal at a node B, which is along the feedback path after the feedback delay $T_{FEEDBACK}$ 203. The DSP system captures sequences of length N for both the reference signal and the feedback signal, which are complex signals. With reference to FIG. 2, a loop delay $L_{delay}$ is defined in equation (1) below.

$$L_{delay} = T_{forward} + T_{feedback} \quad (1)$$

An envelope delay $E_{delay}$ is defined in equation (2) below.

$$E_{delay} = T_{envelope} + T_{feedback} \quad (2)$$

A time delay difference $\Delta\tau$ between the loop delay $L_{delay}$ and the envelope delay $E_{delay}$, which indicates a difference in delay between the forward path and the envelope path, is defined in equation (3) below.

$$\Delta\tau = L_{delay} - E_{delay} \quad (3)$$

Substituting equations (1) and (2) into equation (3) gives equation (4) that defines the time delay difference $\Delta\tau$ as given below.

$$\Delta\tau = T_{forward} - T_{envelope} \quad (4)$$

The loop delay $L_{delay}$, the envelope delay $E_{delay}$, and the time delay difference $\Delta\tau$ are determined by computing a cross-covariance between the envelope waveforms from the reference and feedback signals. The relationship between the loop delay $L_{delay}$, the envelope delay $E_{delay}$, and the time delay difference $\Delta\tau$ can be graphically portrayed by plotting the resulting covariance function versus a time-lag applied to one of the reference signal and the feedback signals. Assuming a batch of data with a length N corresponding to both the reference signal and the feedback signal, the computation of the cross-covariance generates a sequence having a length 2N−1 as defined by equation (5) given below. It is noted that a sample N from a sequence of the batch of data in a length 2N−1 of the cross-covariance vector is used as a reference value in order to determine each delay.

$$C(m) = \frac{1}{N}\sum_{i=1}^{N}\left(|x(i)| - \frac{1}{N}\sum_{j=1}^{N}|x(j)|\right)\left(|y(i-m)| - \frac{1}{N}\sum_{j=1}^{N}|y(j)|\right) \quad (5)$$

In equation (5), "x" is the reference signal captured at node A, as shown in FIG. 2, and "y" is the feedback signal captured at node B, as shown in FIG. 2. The batch of data used in equation (5) is captured under normal operating conditions of the ET-PA system. Accordingly, the feedback signal captured from the feedback path at node B includes the envelope waveforms being sent simultaneously through the envelope path and forward path, as shown in FIG. 2. Because the respective envelope waveforms of the captured reference signal and feedback signal are highly correlated, a visualization of a first cross-correlation peak, whose location is offset from a location of the reference, wherein the reference is the sample N of the cross-covariance vector of length 2N−1, illustrates the delay between respective envelope waveforms, wherein the sample N has no delay, and thus, is a zero sample offset. In addition, a second cross-correlation peak, which is due to the envelope modulation effect on the PA device generated from a bias along the envelope path, may be visualized along with the first cross-correlation peak. The peak location of the first cross-correlation peak may be used to determine the delay between the envelope waveform of the reference signal and the envelope waveform of the feedback signal from the envelope path.

Figure 3A:
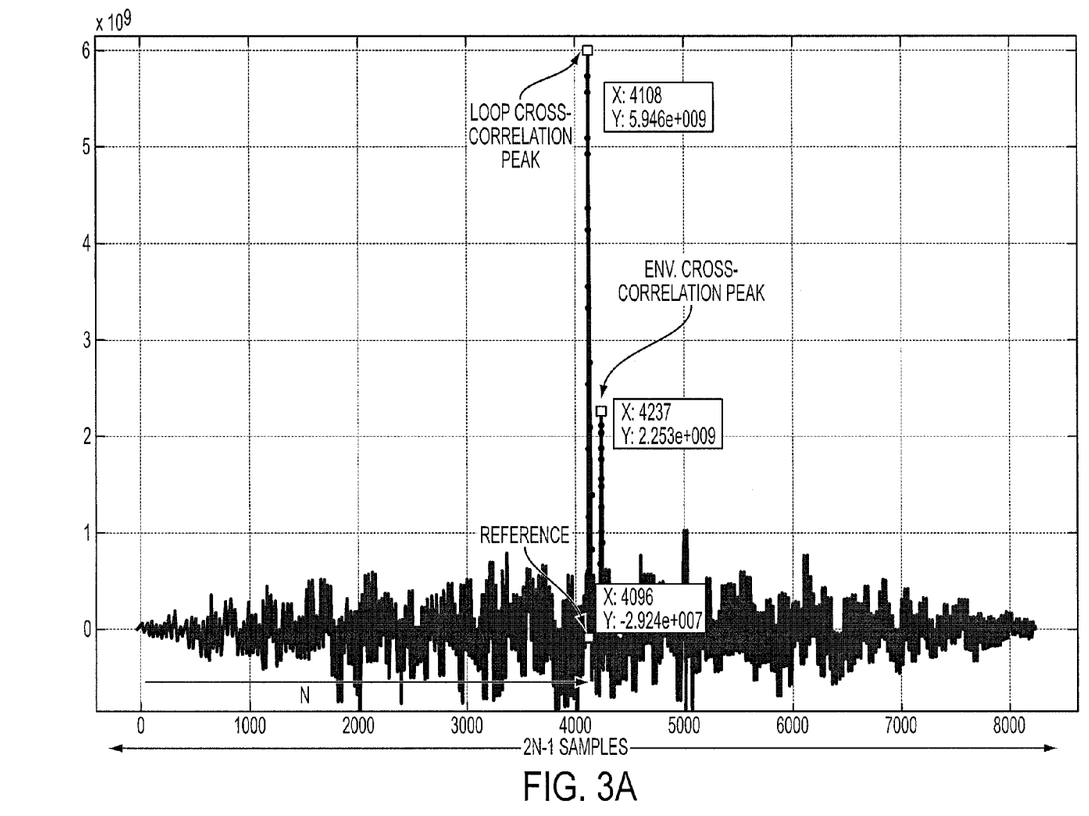
FIG. 3A illustrates a plot of a covariance function according to an exemplary embodiment of the present invention.

FIG. 3A illustrates a plot of a covariance function according to an exemplary embodiment of the present invention.

Figure 3B:
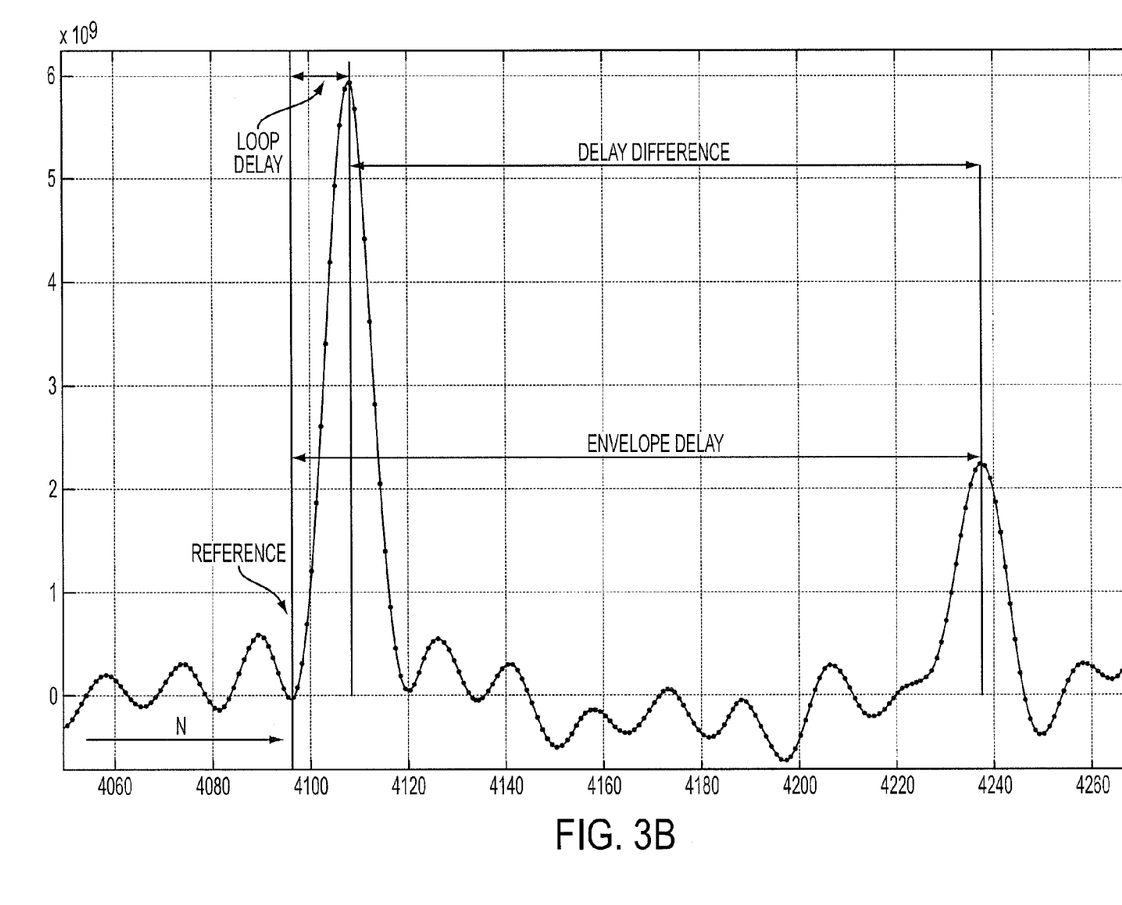
FIG. 3B illustrates an enlarged section of the plot of the covariance function illustrated in FIG. 3A according to an exemplary embodiment of the present invention.

FIG. 3B illustrates an enlarged section of the plot of the covariance function illustrated in FIG. 3A according to an exemplary embodiment of the present invention.

Referring to FIG. 3A, a plot of equation (5), which is the cross-covariance function C(m) represented with a sample length of 2N−1=8191. FIG. 3B is an enlarged version of FIG. 3A. FIG. 3B illustrates two cross-correlation peaks where a location of the highest peak determines the loop delay $L_{delay}$, a location of the second highest peak determines the envelope delay $E_{delay}$, and a difference between the respective locations of the highest peak and the second highest peak determines the delay difference $\Delta\tau$ between the envelope path and the forward path. As shown in FIG. 3B, the loop delay $L_{delay}$ is positive. Accordingly, a delay having a same value as the loop delay $L_{delay}$ is added along the reference path in order to compensate for the loop delay $L_{delay}$.

On the other hand, as shown in FIG. 3B, a location of the second highest peak is different than the location of the first highest peak, wherein a value of the number of samples corresponding to the location of the second highest peak is greater than a value of the number of corresponding to the location of the first highest peak. As calculated according to equation (4), the delay difference $\Delta\tau$ is negative, then, a delay having a same value as the calculated delay difference is added along the forward path in order to compensate for delay difference $\Delta\tau$. However, as shown in equation (1), an adjustment to the factors used to calculate the loop delay, such as a change in the forward path delay, will have a direct effect on the loop delay. Accordingly, in order to account for the effect on the loop delay, the following conditions shown in equation (6) are considered for the calculation of the loop delay.

$$L_{delay} = \begin{cases} T_{forward} + T_{feedback} + \Delta\tau & \Delta\tau \leq 0 \\ T_{forward} + T_{feedback} & \Delta\tau > 0 \end{cases} \quad (6)$$

According to the exemplary embodiments of FIGS. 1-3B, the respective delays are computed according to a batch of data captured at the sample rate of the system for a total of N samples. This sample rate results in a map having a coarse time space, which may result in sub-optimal ET performance. As was noted above, the order of the time resolution of the system may be 20 times greater than the sampling rate of the system. Therefore, the system, because of the order of the time resolution of the system, may use a batch of data with 20×N samples. However, using a total of 20×N samples increases an amount of computation compared to using N samples, thus making the use of 20×N samples impractical and a limitation on optimal ET performance.

In order to overcome such limitation, according to an exemplary embodiment of the present invention, there is provided a Time Alignment (TA) procedure that extracts a low number of samples from the two cross-correlation peaks (as shown in FIG. 3B) by sectoring the cross-covariance function using an optimal peaks search algorithm. The algorithm finds all local maxima in 2N−1 samples and returns a vector of peaks whose indexes are related to the cross-covariance function. Next, by comparing peaks values included in the vector of peaks, a highest peak, the second highest peak, and a set of values respectively neighboring the highest peak and the second highest peak are extracted from the vector of peaks. The highest peak, the second highest peak, and the set of neighboring values are used as reference points that are interpolated between in order to increase the time resolution of the computation.

Figure 3C:
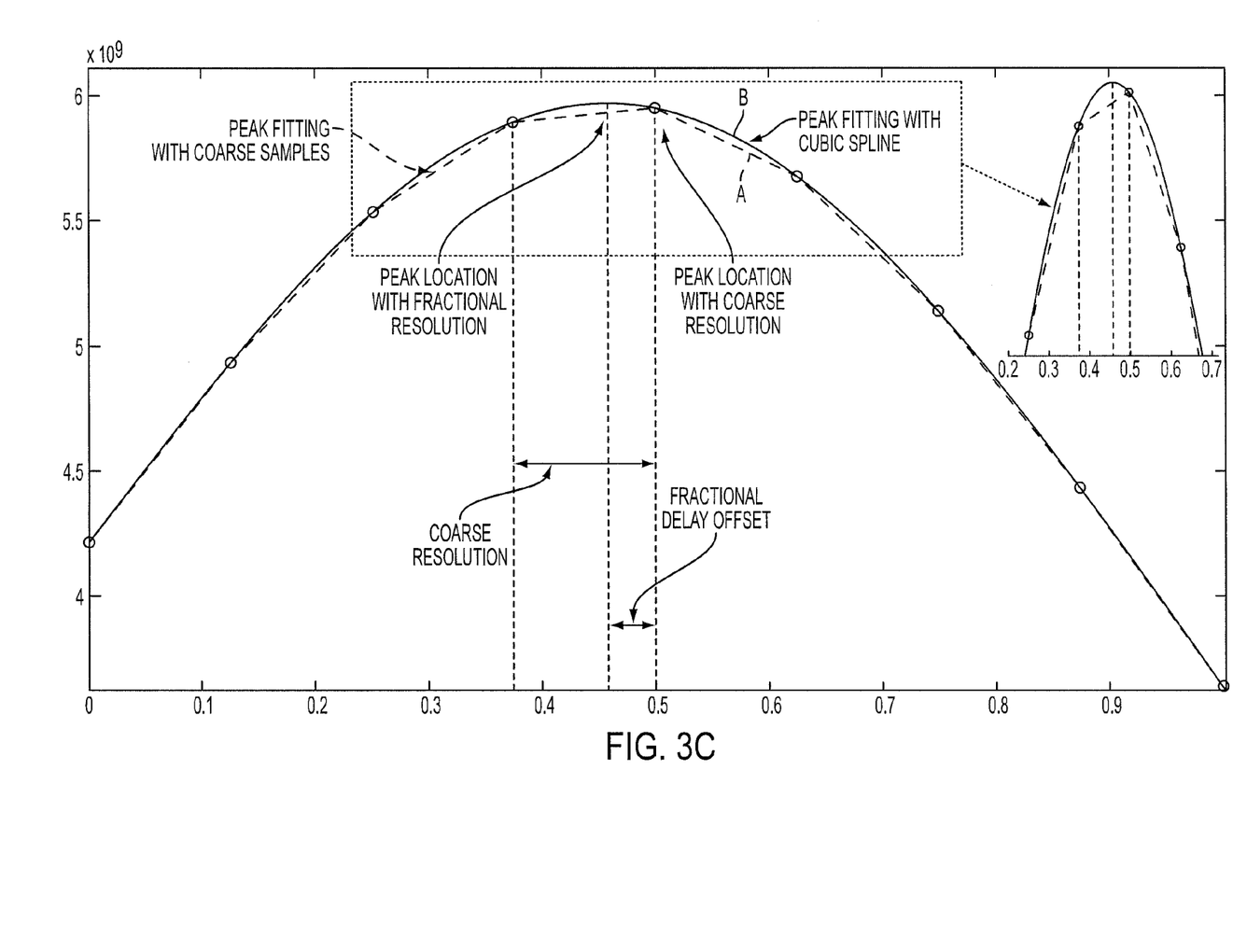
FIG. 3C illustrates a cross-covariance peak according to an exemplary embodiment of the present invention.

FIG. 3C illustrates a cross-covariance peak according to an exemplary embodiment of the present invention.

Referring to FIG. 3C, a first cross-covariance peak and a set of eight neighboring samples are plotted without interpolation as the dashed line A, and the solid line B illustrates a high resolution plot showing an estimated second cross-covariance peak using a cubic spline interpolation applied to nine coarse samples with an interpolation factor of 100. As shown in FIG. 3C, there is an appreciable time difference between the first cross-covariance peak location of line A, which is determined by using a coarse resolution, and the second cross-covariance peak location of line B, which is determined by using a fractional resolution.

This time difference between the first and the second cross-covariance peaks, as shown in FIG. 3C, is a fractional delay offset a peak location being shifted due to the fractional delay estimation. The second cross-covariance peak location is determined by constructing piecewise third-order polynomials that pass through the nine samples that are interpolated to form line B. The $i^{th}$ piece of the cubic spline interpolation is given by equation (7).

$$C_i(m) = a_i + b_i m + c_i m^2 + d_i m^3, \quad (7)$$

where $m \in [0,1]$ and $i=0, 1, 2, \ldots, n-1$, wherein "n" is the numbers of samples used for the spline interpolation.

A second derivative of each polynomial of the cubic spline interpolation, i.e., the polynomials of equation (7), is set to be zero at each of the nine coarse samples in order to provide a boundary condition between the polynomials that complete a set of 4n−2 equations that are to be solved. In addition to the cubic spline interpolation, the TA procedure provides an alternative interpolation solution using Newton's forward interpolation method, which is a quadratic interpolation polynomial where coefficients are estimated using a recursive division process. The cross-covariance vector is expanded using a Taylor expansion around each peak, wherein only tree samples are used, one on either side of the predicted local maxima. The quadratic polynomial is given by equation (8) shown below.

$$C_s(m) = a + bm + cm^2, \quad (8)$$

wherein subscript "s" denotes a section of the cross-covariance vector that corresponds to the peak section in the C(m) vector. The coefficients a, b, and c are given by equation (9) shown below.

$$a = c(-\Delta m) - 2c(0) - c(\Delta m)/2\Delta m^2 \text{ for } a<0$$

$$b = c(\Delta m) - c(-\Delta m)/2\Delta m,$$

$$c = c(0), \quad (9)$$

wherein $\Delta m$ is one half of the sampling interval of the cross-covariance C(m).

As shown in the exemplary embodiment discussed above, the TA procedure substantially reduces the number of samples used to calculate the cross-covariance peaks from 4096 samples to 9 or even 3 samples for each cross-covariance peak. The substantial reduction of samples used to calculate the peak locations allows for the interpolation factor to be increased to a very high value, which then improves the computational accuracy and allows for a reduced or more optimal computation time.

As was noted above, in the TA procedure of the present exemplary embodiment, the cubic spline interpolation method and the Newton's forward interpolation method are disclosed as being used in the TA procedure. However, the present invention is not limited thereto, and the TA procedure may use any number of suitable interpolation methods.

Figure 4:
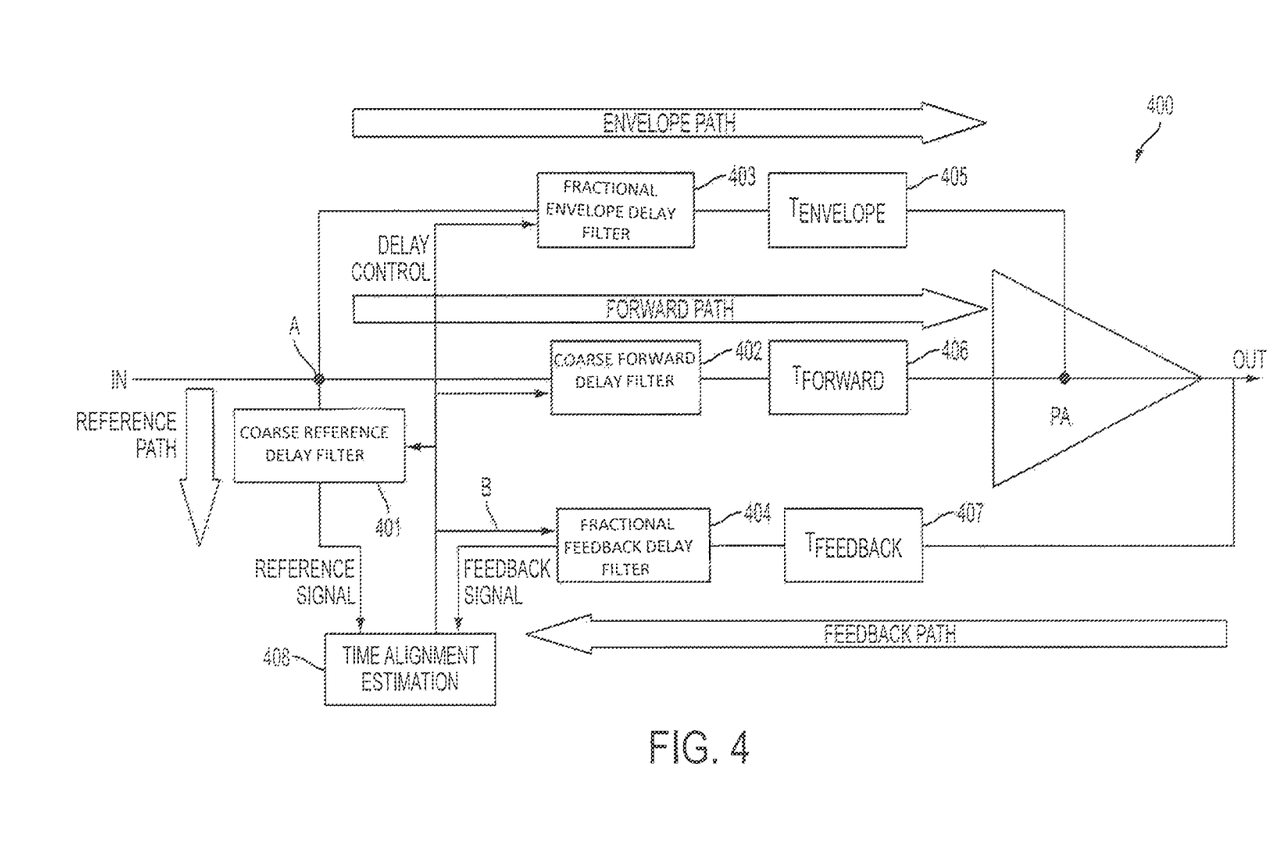
FIG. 4 is a block diagram of an Envelope Tracking (ET) system including a Time Alignment (TA) procedure according to an exemplary embodiment of the present invention.

FIG. 4 is a block diagram of an ET system including a TA procedure according to an exemplary embodiment of the present invention.

Referring to FIG. 4, the ET system 400 includes two blocks representing filters having coarse delays, a coarse reference delay filter 401 in the reference path and a coarse forward delay filter 402 in the forward path. The ET system 400 also includes two blocks representing fractional delay filters and corresponding delays, a fractional envelope delay filter 403 located along the envelope path and a fractional feedback delay filter 404 located along the feedback path. As shown in FIG. 4, a delay along the envelope path is illustrated by $T_{ENVELOPE}$ 405, a forward path delay is illustrated by $T_{FORWARD}$ 406, and a feedback path delay is illustrated by $T_{FEEDBACK}$ 407.

During a first estimation using the TA procedure discussed above, a TA estimation block 408 sets three filters, i.e., the coarse reference delay 401, the fractional envelope delay 403, and the fractional feedback delay 404, to have zero delay. The TA estimation block 408 sets the coarse forward delay 402 to have a delay of the middle value of the delay range, which allows negative tuning when $\Delta\tau$ becomes positive. During a parameter adaptation process wherein the TA estimation block 408 adjusts the filters to the above noted delay differences, due to environmental changes affecting transmission of RF signals, the TA procedure computes and adjusts the delay differences according to the previous values of the delay values.

Figure 5:
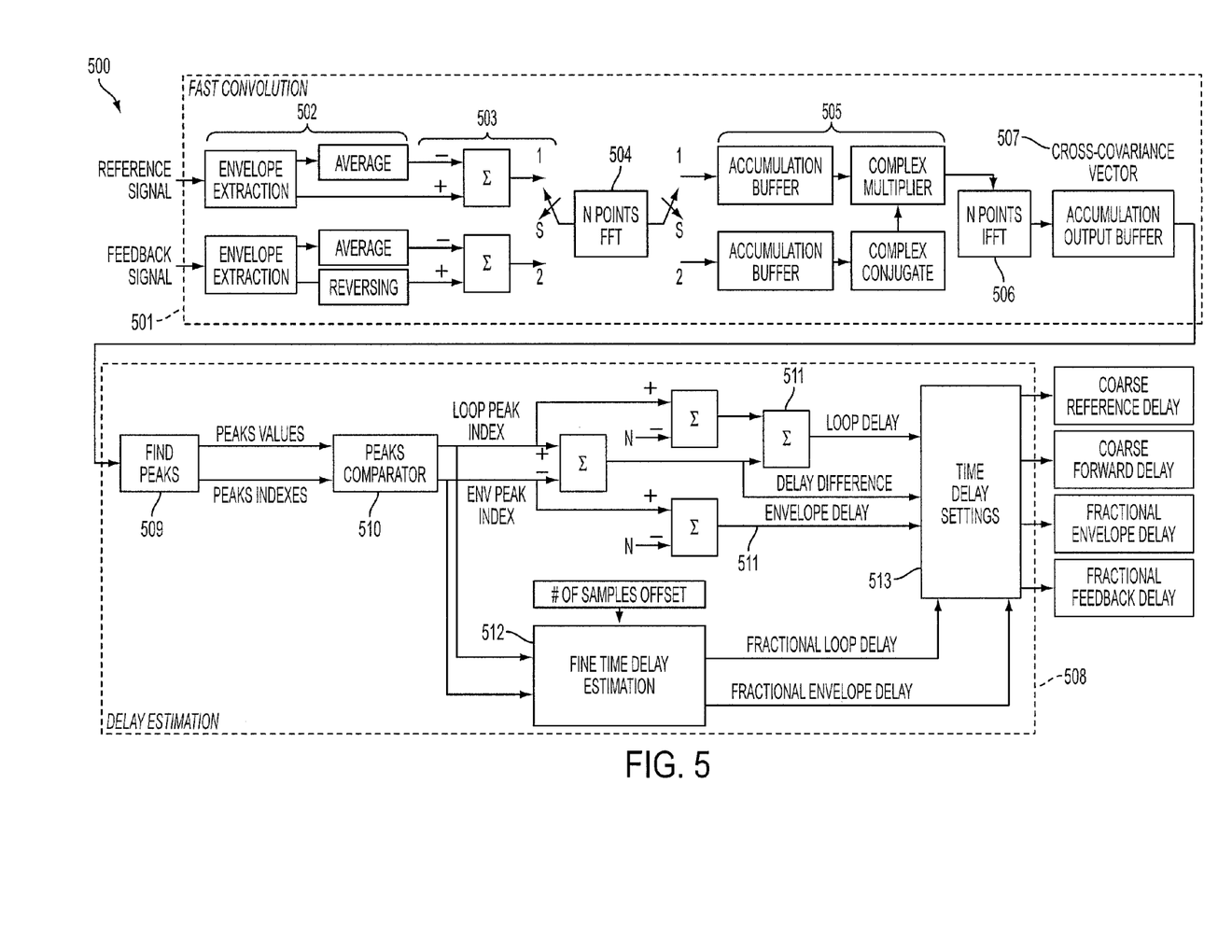
FIG. 5 is a block diagram and flow chart illustrating operation of the TA estimation block of FIG. 4 according to an exemplary embodiment of the present invention.

FIG. 5 is a block diagram and flow chart illustrating operation of the TA estimation block of FIG. 4 according to an exemplary embodiment of the present invention.

Referring to FIG. 5, a TA estimation system 500 divides the TA procedure into two primary operations, a fast convolution operation 501 and a delay estimation operation 508. In the TA procedure employed by the TA estimation system 500, a correlation of both the reference signal and the feedback signal is calculated by multiplication in the frequency domain using a Fast Fourier Transform (FFT) to compute a circular convolution, and converting computed circular convolution back to the time domain using an Inverse FFT (IFFT).

More particularly, in the TA procedure of FIG. 5, at step 502, respective envelopes of the reference signal and the feedback signal are extracted from the respective signals. Next, averages of both the reference signal envelope and the feedback signal envelope are removed in step 503 in order to compute a cross-covariance vector instead of the cross-correlation vector. Additionally, in step 503, the feedback signal envelope is reversed following a convolution rule. Accordingly, when the signal lengths of the feedback signal and the reference signal are long, the TA procedure employed by the TA estimation system 500 produces a convolution result faster than a conventional convolution procedure.

Next, in step 504, the correlation between the reference signal and the feedback signal is calculated by sampling the respective reference signal envelope and the feedback signal envelope N times and then multiplying the sampled signals in the frequency domain using a Fast Fourier Transform (FFT) in order to compute a circular convolution using the complex multiplier and the complex conjugate, as shown in step 505. Next, in step 506, the computed circular convolution is converted back to the time domain using an Inverse FFT (IFFT), thus producing a cross-covariance vector that is stored in an accumulation output buffer, as shown in step 507. As seen in FIG. 5, and step 506 and 507, the cross-covariance vector is computed using sequences of coarse samples having a length of N samples.

The delay estimation operation 508 computes the delay estimation by sectoring the samples of the cross-covariance vector in order to find peaks of the cross-covariance vector in step 509 and comparing the peaks in step 510 in order to determine both a loop peak index and an envelope peak index which respectively correspond to the locations of the loop peak and the envelope peak. Then, in step 511, the delay difference $\Delta\tau$ is computed as the difference of respective peak locations, or in other words, by subtracting the envelope peak index from the loop peak index. Also, in step 511, the loop delay and the envelope delay are computed by referencing each of the loop peak index and the envelope peak index to the N samples. Then, in step 512, a section of each of the envelope peak and the loop peak is extracted so as to include a set of offset neighboring samples that are proximate to the locations of the envelope peak and the loop peak.

Each of the envelope peak section and the loop peak section, including the respective sets of the offset neighboring samples, are processed in step 512, which is a fine time delay estimation operation, so as to generate a fractional loop delay and a fractional envelope delay. Next, in step 513, the loop delay, the envelope delay, the delay difference, the fractional loop delay and the fractional envelope delay are used to time delay settings. The fine time delay estimation operation shown as step 512 in FIG. 5 is discussed in further detail below, with reference to FIG. 6. Additionally, the time delay settings operation of step 513 is discussed in further detail below, with reference to FIG. 7.

Figure 6:
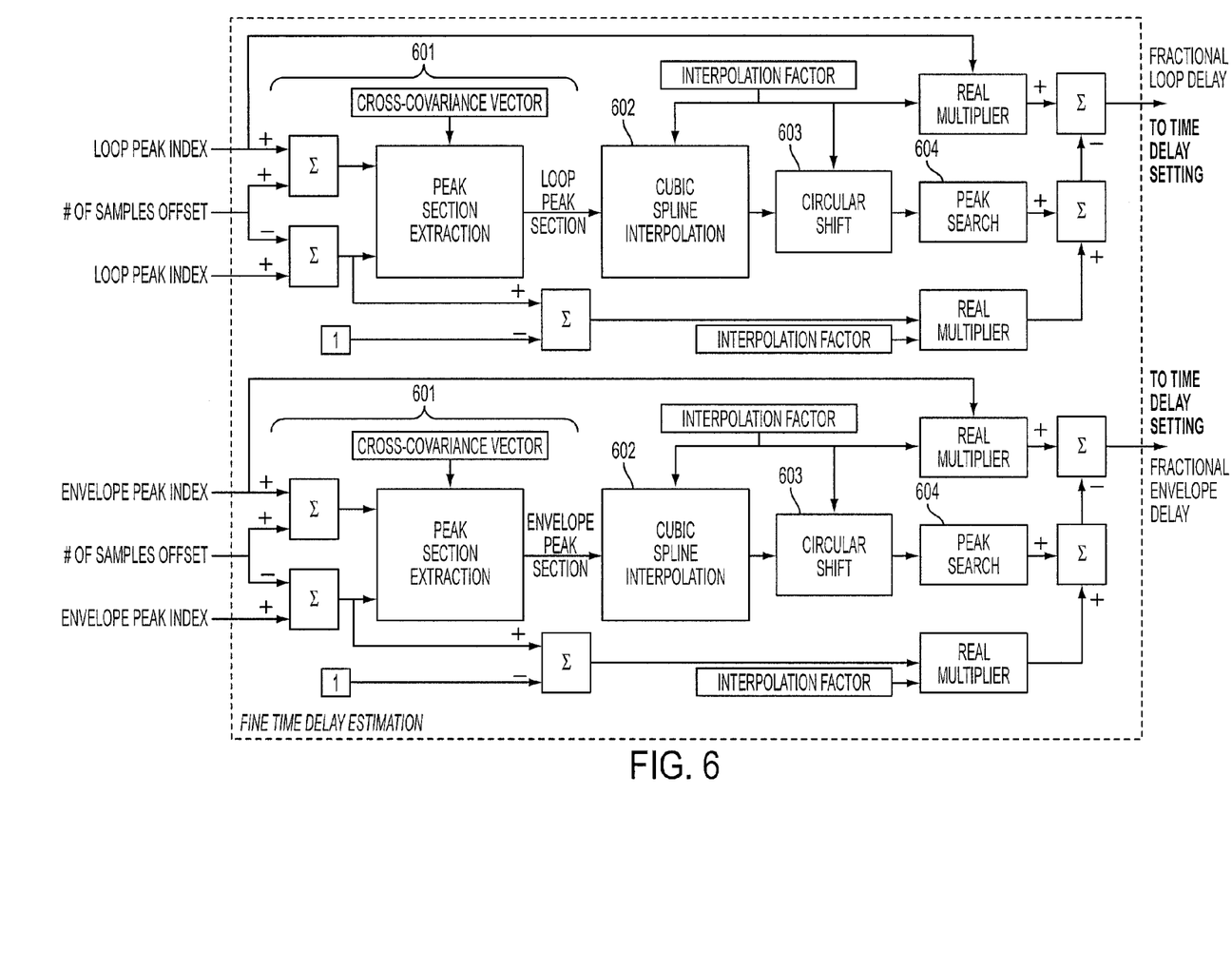
FIG. 6 illustrates a fine time delay estimation process according to an exemplary embodiment of the present invention.

FIG. 6 illustrates a fine time delay estimation process according to an exemplary embodiment of the present invention.

Referring to FIGS. 5 and 6, after finding the peaks of the cross-covariance vector in step 509 and comparing the peaks in step 510, as shown in FIG. 5, the envelope peak index and the loop peak index are used to compute a fine time delay estimation in step 512. More specifically, the loop peak index and the envelope peak index are processed separately in the fine time delay estimation, as shown in FIG. 6. In step 601, respective sections of the loop peak index and the envelope peak index are extracted as well as respective sets of neighboring samples that are offset from the respective loop and envelope peak locations.

Next, in step 602, the sections of the loop peak index and the envelope peak index are respectively interpolated by using the cubic spline interpolation method. However, as noted above, the present invention is not limited thereto, and the interpolation may be done using Newton's forward interpolation method or any other suitable interpolation method. Next, in step 603, the interpolated envelope peak section and the interpolated loop peak section are respectively shifted to zero, using a circular shift, according to the interpolation factor so as to have the interpolated envelope section and the interpolated loop peak share a common reference point. Next, in step 604, a peak search is conducted for each of the interpolated and shifted envelope and loop peak sections, which are then respectively summed with respective real multipliers generated according to a respective summation of a −1 offset with the loop peak index and the envelope peak index, so as to generate a fractional envelope delay and a fractional loop delay.

Figure 7:
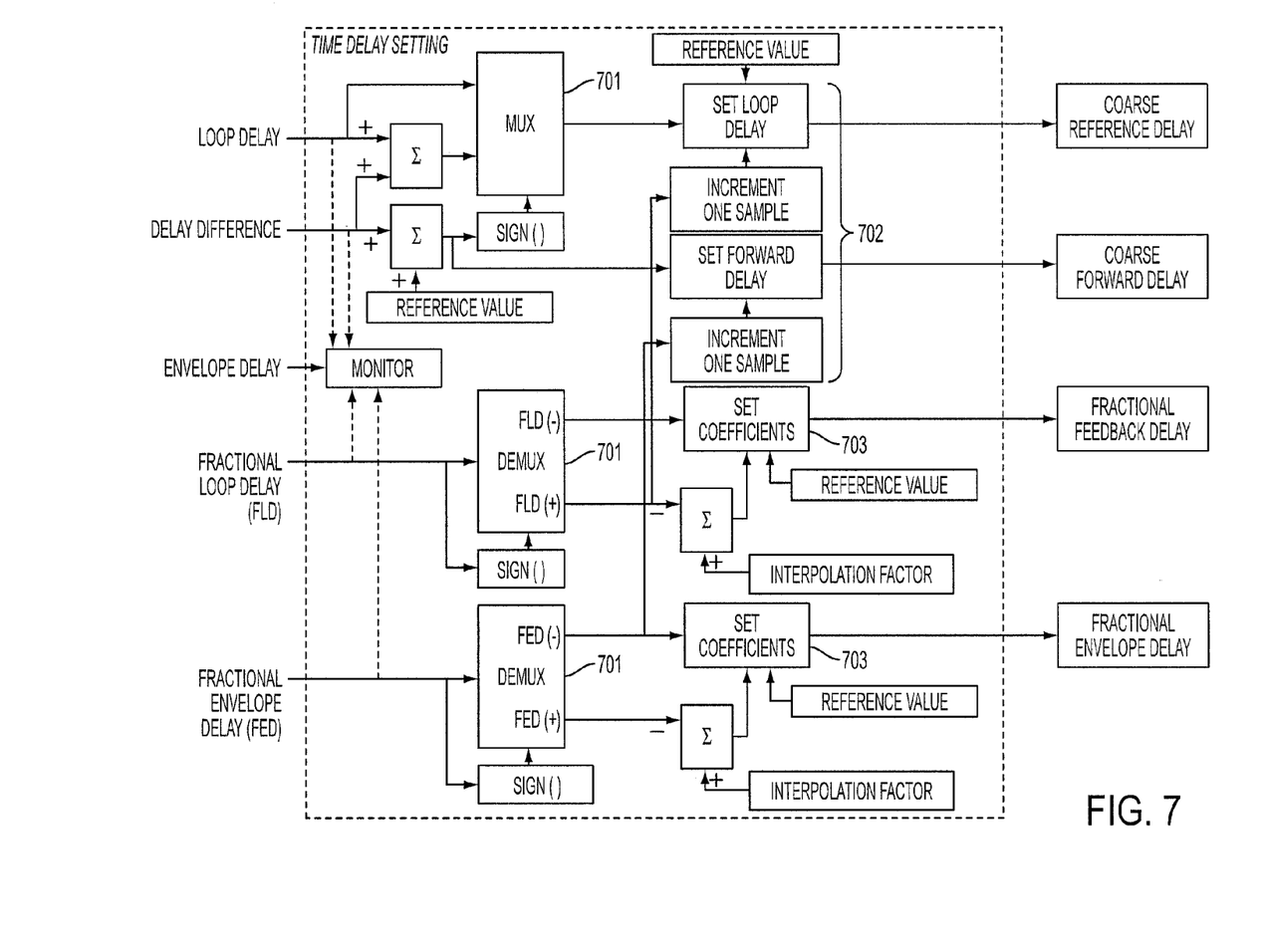
FIG. 7 illustrates a time delay setting operation of FIG. 5 according to an exemplary embodiment of the present invention.

FIG. 7 illustrates a time delay setting operation of FIG. 5 according to an exemplary embodiment of the present invention.

Referring to FIGS. 5 and 7, in step 513, the loop delay, the delay difference, the envelope delay, and the fractional envelope and loop delays are used to calculate the time delay settings in order to adjust or update each of the delay blocks, which are discussed above with reference to FIG. 4. In FIG. 7, the reference values used in the various operations are the previous values of each respective delay and are used in each update step during the parameter adaptation mode used to adjust the respective filters so as to have updated delay values. In step 701, Multiplexing (MUX) and Demultiplexing (DEMUX) operations are conducted in a manner so as to follow a logical condition based on the sign of the input variable. In the case of the loop delay, the MUX operation of step 701, the loop delay and the delay difference are multiplexed, wherein the MUX operation allows for consideration of negative tuning when $\Delta\tau$ become positive after the use of equation (6). In the case of the fractional loop and envelope delays, the DEMUX operation of step 701 respectively demultiplexes the fractional loop delay and the fractional envelope delay, wherein the DEMUX operation allows for consideration of negative values for the fractional delay offsets (see FIG. 3C).

After the MUX operation of step 701, in step 702, the multiplexed loop delay and delay difference is incremented by one coarse sample in order to determine the current loop delay and in order to produce the coarse reference delay. Additionally, in step 702, in a case where the logical condition of a sign of the DEMUX block is true, the delay difference is incremented by one coarse sample in order to set the forward delay, which is used to generate the coarse forward delay. Next, in step 703, in order to generate the fractional envelope delay and the fractional feedback delay, after the DEMUX operation of step 701, the interpolation factors are respectively combined with the demultiplexed fractional loop delay and the fractional envelope delay, which is then used to respectively set coefficients of the fractional envelope delay and the fractional feedback delay in consideration of the reference values. Accordingly, the coarse reference delay, the coarse forward delay, the fractional envelope delay, and the fraction feedback delay are produced by the TA procedure according to an exemplary embodiment of the present invention, so as to be applied in a manner illustrated in FIG. 4.

However, aspects of the present invention are not limited to the TA procedure discussed above. For example, in a case where it isn't necessary to determine the loop time alignment, the time mismatch for the envelope time alignment can be determined in a straightforward manner by only performing the autocorrelation/auto-covariance of the feedback signal instead of the cross-correlation/cross-covariance between the input and feedback signals. Such a procedure may increase the time resolution of the TA system due to, for a same size of internal memory, the number of samples used being doubled for the autocorrelation of the feedback signal.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A method for performing Time Alignment (TA) for an Envelope Tracking (ET) Radio Frequency (RF) Power Amplifier (PA) having an input signal, including a complex signal, that is propagated along a forward path of the ET RF PA having a forward path delay, a reference signal that is propagated along a zero-delay reference path of the ET RF PA, and a feedback signal, extracted from an output node of the ET RF PA, propagating along a feedback path having a feedback path delay, the method comprising:
    generating samples of the reference signal and the feedback signal at a sampling rate of 1/N to generate a captured sequence of data having a length of N samples, N being a value greater than or equal to one;
    calculating a cross-covariance of the feedback signal and the reference signal according to the captured sequence of data in order to generate a cross-covariance vector;
    determining peak values and corresponding index values of the N samples of the cross-covariance vector;
    determining a loop peak index and an envelope peak index;
    determining a delay difference between the envelope peak index and the loop peak index;
    determining an envelope delay and a loop delay respectively according to the envelope peak index and the loop peak index;
    performing a fine time delay estimation in order to generate a fractional envelope delay and a fractional loop delay respectively according to the envelope peak index and the loop peak index; and
    generating time delay settings according to the delay difference, the loop delay, the envelope delay, the fractional loop delay, and the fractional envelope delay,
    wherein the time delay settings include a coarse reference delay, a coarse forward delay, the fractional envelope delay and a fractional feedback delay.

2. The method of claim 1, wherein the loop delay is equal to a summation of the forward path delay and the feedback path delay.

3. The method of claim 1, wherein the envelope delay is equal to a summation of an envelope path delay and the feedback path delay,
    wherein the envelope path delay is a delay of an envelope path of the ET RF PA along which an envelope waveform corresponding to the complex signal is propagated.

4. The method of claim 3, wherein a respective interpolation of the loop peak section and a respective interpolation of the envelope peak section comprise using one of a cubic spline interpolation method and Newton's forward interpolation method.

5. The method of claim 1, wherein the determining of the loop peak index and the envelope peak index comprises comparing the peak values of the cross-covariance vector, the loop peak index being a location of a loop peak, and the envelope peak index being a location of an envelope peak.

6. The method of claim 1, wherein the performing of the fine time delay estimation comprises:
    extracting a loop peak section including a loop peak and neighboring samples from the cross-covariance vector according to the loop peak index;
    extracting an envelope peak section including an envelope peak and neighboring samples from the cross-covariance vector according to the envelope peak index;
    respectively interpolating the loop peak section and the envelope peak section;

respectively shifting the interpolated loop peak section and the interpolated envelope peak section to originate at zero;

determining the fractional envelope delay according to a location of the envelope peak included in the shifted envelope peak section; and determining the fractional loop delay according to a location of the loop peak in the shifted loop peak section.

7. The method of claim 1, wherein the generating of the time delay settings comprises:

multiplexing the loop delay and the loop delay including the delay difference;

respectively demultiplexing the fractional loop delay and the fractional envelope delay;

incrementing the multiplexed loop delay by a first coarse sample and incrementing the delay difference by a second coarse sample;

setting the incremented multiplexed loop delay as the coarse reference delay;

setting the incremented delay difference as the coarse forward delay;

respectively setting coefficients of the fractional envelope delay and the fractional feedback delay according to the demultiplexed fractional loop delay and the demultiplexed fractional envelope delay according to an interpolation factor and a reference value; and generating the fractional envelope delay and the fractional feedback delay according to the set coefficients.

8. The method of claim 7, wherein the first coarse sample corresponds to the demultiplexed fractional loop delay, and wherein the second coarse sample corresponds to the demultiplexed fractional envelope delay.

9. The method of claim 7, wherein the reference values are previous values of respective delay values being set.

10. The method of claim 1, wherein the loop delay equals a summation of the forward path delay, the feedback path delay, and the delay difference when the delay difference is less than or equal to zero, and wherein the loop delay equals a summation of the forward path delay and the feedback path delay when the delay difference is greater than zero.

11. A Time Alignment (TA) apparatus for an Envelope Tracking (ET) Radio Frequency (RF) Power Amplifier (PA) having an input signal, including a complex signal, that is propagated along a forward path of the ET RF PA having a forward path delay, a reference signal that is propagated along a zero-delay reference path of the ET RF PA, and a feedback signal, extracted from an output node of the ET RF PA, propagating along a feedback path having a feedback path delay, the apparatus comprising:

a fast convolution unit configured to receive the reference signal and the feedback signal, to extract respective envelopes of the reference signal and the feedback signal, and to generate a cross-covariance vector for the reference signal envelope and the feedback signal envelope;

a delay estimation unit configured to receive the cross-covariance vector from the fast convolution unit, to determine peak values of the cross-covariance vector, to perform a fine time delay estimation, and to generate time delay settings according to the fine time delay estimation; and delay filters configured to respectively delay a timing of the reference signal and the feedback signal according to the generated time delay settings.

12. The apparatus of claim 11, wherein the fast convolution unit comprises:

a Fast Fourier Transform (FFT) unit configured to correlate the reference signal envelope and the feedback signal envelope by multiplication in the frequency domain using a FFT; and an Inverse FFT (IFFT) unit configured to compute a circular convolution and to convert the computed circular convolution back to the time domain using an IFFT so as to generate the cross-covariance vector.

13. The apparatus of claim 11, wherein the delay estimation unit comprises a fine time delay estimation unit configured to respectively extract a loop peak section including a loop peak and neighboring samples and an envelope peak section including an envelope peak and neighboring samples from the cross-covariance vector received from the fast convolution unit, and to respectively perform interpolations of the loop peak and the envelope peak section so as to respectively generate a fractional loop delay and a fractional envelope delay, wherein the loop peak section is extracted according to a location of the loop peak and the envelope peak section is extracted according to a location of the envelope peak.

14. The apparatus of claim 13, wherein the respective interpolation of the loop peak section and the respective interpolation of the envelope peak section comprise using one of a cubic spline interpolation method and Newton's forward interpolation method.

15. The apparatus of claim 13, wherein the delay estimation unit further comprises a time delay setting unit configured to receive the fractional loop delay and the fractional envelope delay from the fine time delay estimation unit, to generate a new fractional envelope delay according to an interpolation factor, to generate a fractional feedback delay, to generate a coarse reference delay according to a received loop delay, and to generate a coarse forward delay according to a delay difference, wherein the delay difference is a difference between an envelope peak index and a loop peak index, and wherein the envelope peak index is a location of the envelope peak and the loop peak index is a location of the loop peak.

16. The apparatus of claim 15, wherein the received loop delay is equal to a summation of the forward path delay and the feedback path delay.

* * * * *